United States Patent [19]

Sokolovsky et al.

[11] Patent Number: 4,804,172
[45] Date of Patent: Feb. 14, 1989

[54] FIXTURE FOR MOUNTING A HEAT SINK

[75] Inventors: Paul J. Sokolovsky, Sunnyvale; Chuck Anderson, Santa Clara, both of Calif.

[73] Assignee: Advanced Micro Devices, Inc., Sunnyvale, Calif.

[21] Appl. No.: 124,729

[22] Filed: Nov. 24, 1987

[51] Int. Cl.$^4$ .............................. B25B 1/00; F28F 7/00
[52] U.S. Cl. .............................. 269/254 R; 165/80.2; 165/80.3
[58] Field of Search .................... 29/281.5, 760; 165/80.2, 80.3; 269/156, 238, 254 R

[56] References Cited

U.S. PATENT DOCUMENTS

| 4,630,172 | 12/1986 | Stenerson et al. | 357/81 X |
| 4,712,159 | 12/1987 | Clemens | 165/80.3 X |
| 4,731,693 | 3/1988 | Berg et al. | 165/80.2 X |

Primary Examiner—Steven Mottola
Attorney, Agent, or Firm—David Chin

[57] ABSTRACT

A fixture for mounting and aligning a heat sink to a PGA chip package disposed in a Murphy-type carrier includes a substantially flat, rectangularly-shaped plate (51), a first end portion (53a), and a second end portion (53b). The plate member (51) has a top surface (54) and a bottom surface (52). The plate member (51) further includes a top side edge (44), a bottom side edge (46), a left side edge (48) and a right side edge (50). Retaining means are formed in a central portion of the bottom surface (52) of the plate member (51) to releasably hold the heat sink. The first and second end portions (53a, 53b) are pivotally connected on opposite sides of two of the four side edges (44-50) of the plate member (51) and include hooked portions (70a, 70b) for releasably engaging a bottom surface of the Murphy-type carrier. The first and second end portions (53a, 53b) further include actuating members (66a, 66b) for moving outwardly the hooked portions (70a, 70b) away from the center of the plate member (51) when they are squeezed toward each other so as to permit mounting or removal of the fixture to the Murphy-type carrier.

19 Claims, 2 Drawing Sheets

FIXTURE FOR MOUNTING A HEAT SINK

BACKGROUND OF THE INVENTION

This invention relates generally to semiconductor and component packaging technology and more particularly, it relates to a fixture for mounting a heat sink to a pin grid array (PGA) integrated circuit chip package disposed in a PGA carrier.

Over the past years, there has been an increasing need for high density packaging for large scale integration (LSI) devices. In response to this demand, there has been developed in the industry a common arrangement referred to in the art as a pin grid array (PGA) chip package. Typically, the PGA chip package includes a main body member having a generally rectangular or square configuration. A plurality of metal terminal pins extend from the top surface of the body member to protrude from its bottom surface. The plurality of pins are disposed in the form of rows and columns so as to provide a matrix array. In order to protect the terminal pins of the PGA packages from being bent, damaged or possible destruction during handling, testing and shipping, the PGA packages are generally mounted or loaded into some kind of chip carrier. One conventional kind of chip carrier in the art has a centrally disposed recess and releasable tabs extending from two opposite sides of the carrier forming what is generally known as a Murphy-type carrier.

The Murphy-type carriers are recognized as a provider of adequate protection for the terminal pins of the PGA package during handling and shipment. However, in order to overcome the problem of inferior heat dissipation experienced by such carriers, there has arisen the need of mounting a heat sink to the central portion of the top surface of the PGA package. The requirement for such heat dissipation is becoming more significantly important due to the advent of highly sophisticated integrated circuit chips having a higher degree of integration so as to maintain the temperature of the I.C. chips to be within its desired operating limits.

Typically, a small disc-shaped preform is used to attach the heat sink to the top surface of the PGA package which is already disposed in the Murphy-type carrier. One surface of the preform is placed onto the top surface of the PGA package, and then the heat sink is placed onto the other surface of the preform. It is generally required that the PGA package disposed in the carrier, preform and heat sink all be place in proper registration or vertical alignment prior to a heat curing process. The heat curing process is a bonding technique for permanently securing the heat sink to the PGA package so as to form an integral unit. It has been encountered heretofore the problem of visually aligning the PGA package, preform and heat sink prior to effecting such heat curing process.

It is therefore believed that what is needed is a fixture for mounting a heat sink to a PGA chip package disposed in a Murphy-type carrier so as to maintain vertical alignment and preload during a heat curing process. It would also be expedient to provide a fixture which is formed of a relatively simple construction and can be easily operated without the need of complicated, mechanism instructions for aligning of all of the components, but yet has enough strength to provide pressure on preform without deformation due to heat and to withstand normal physical handling as well as abuses in the production environment. The fixture should also be designed so as to facilitate stacking when needed as during the heat curing process, thereby reducing labor costs. The fixture of the present invention for mounting a heat sink to a PGA package or unit has been designed with all of these features which have been traditionally unavailable.

SUMMARY OF THE INVENTION

Accordingly, it is a general object of the present invention to provide a fixture of a design which can be employed for mounting and aligning a heat sink to a PGA package disposed in a Murphy-type carrier.

It is another object of the present invention to provide a fixture for mounting and aligning a heat sink to a PGA chip package disposed in a Murphy-type carrier in which the fixture is formed of a relatively simple construction and can be operated without the need of complex instructions.

It is another object of the present invention to provide a fixture for mounting and aligning a heat sink which is fabricated of a synthetic organic polymer which has enough strength to withstand required temperatures and normal handling as well as physical abuses in the production environment.

It is still another object of the present invention to provide a fixture for mounting a heat sink which is stackable when used for aligning of the heat sink to the PGA package during a heat curing process.

In accordance with these aims and objectives, the present invention is concerned with the provision of a fixture for mounting and aligning a heat sink to a PGA chip package disposed in a Murphy-type carrier which includes a substantially flat, rectangular-shaped plate member, a first end portion, and a second end portion. The plate member has a top surface and a bottom surface. The plate member further includes a top side, a bottom side, a left side and a right side. The first end portion is also formed of a rectangular shape and is joined at its intermediate area to the left side of the plate member. The second end portion is also formed of a rectangular shape and is joined at its intermediate area to the right side of the plate member. Retaining means are formed in a central portion of the bottom surface for releasably holding the heat sink.

The first end portion includes a first member extending vertically above the top surface of the plate member and a second member extending vertically below the bottom surface of the plate member. The second member of the first end portion has a hooked portion disposed at its lower end. The second end portion includes a first member extending vertically above the top surface of the plate member and a second member extending vertically below the bottom surface of the plate member. The second member of the second end portion has a hooked portion disposed at its lower end. The hooked portions are moved outwardly away from the central portion of the fixture when the first members of the respective first and second end portions are squeezed toward each other so as to permit mounting or removal of the fixture to the Murphy-type carrier.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
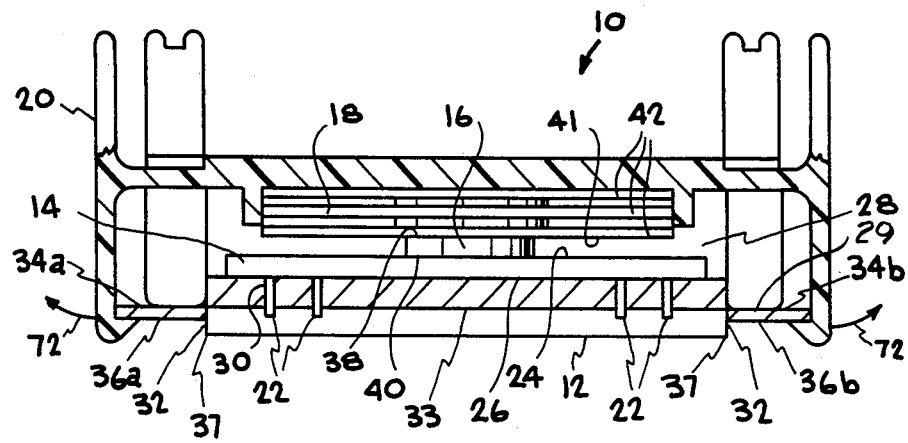
FIG. 1 is an exploded, cross-sectional view of the fixture of the present invention used for mounting and aligning of the heat sink, preform and PGA package disposed in the Murphy-type carrier.

Referring now in detail to the various view of the drawings, there is shown in FIG. 1 an exploded, cross-sectional view of an assembled package 10. The assembled package 10 includes a conventional Murphy-type carrier 12, a pin grid array (PGA) chip package or unit 14, a preform member 16, a heat sink 18, and a mounting fixture 20. The mounting fixture 20 of the present invention is used to insure proper registration or vertical alignment of the PGA unit 14 disposed in the carrier 12, the preform member 16 and the heat sink 18 prior to placing of the assembled package into an oven or the like for a heat curing process. This results in substantial savings in labor costs since visual alignment of the various components by an operator has been eliminated. During this heat curing, the top and bottom surfaces of the preform member 16 will become permanently secured to the respective surfaces of the heat sink 18 and the PGA unit 14. Further, the mounting fixture is designed so as to facilitate stacking of a number of assembled package 10 in a column during this heat curing process, thereby reducing additional time-consuming labor costs.

The PGA unit 14 is typically formed of a rectangular or square configuration in which the dimensions of the four edges are varying in width and length. This is because the PGA unit 14 is dependent upon the number of terminal pins which may vary from sixty-eight to one hundred and sixth-eight. A plurality of such metal terminal pins 22 extend from a top surface 24 of the PGA unit 14 to protrude from its bottom surface 26. The plurality of terminal pins are generally arranged in the form of rows and columns so as to provide a matrix array. The Murphy-type carrier 12 is used to protect the terminal pins 22 of the PGA unit 14 from being bent, damaged or possible destruction during handling, testing and shipping.

The Murphy-type carrier 12 is comprised of a substantially square-shaped solid body member with a centrally disposed recess or cavity 28. The cavity 28 is provided with a plurality of openings or holes 30 which are aligned in rows and columns so as to receive the corresponding pins 22 of the PGA unit 14. The square-shaped body member has four side portions 32 and a bottom surface 33. Each of the four side portions 32 has a dimension of approximately 2.750 inches in overall length. Adjacent the left end of the side portion 32, there is provided a vertical section 34a having a lower flange 36a. Similarly, adjacent the right end of the side portion 32 there is provided a vertical section 34b having a lower flange 36b. The lower flanges 36a, 36b are raised above the bottom edges 37 of the side portions 32 and are used to retain the fixture as will be explained more fully hereinafter.

The preform member 16 consists of a small disc-shaped piece having a top surface 38 and a bottom surface 40. The preform member is positioned so that its bottom surface 40 is centrally located over the top surface 24 of the PGA unit 14. The top surface 38 of the preform member 16 engages the bottom surface 41 in the central portion of the heat sink 18. During the heat curing process, the top surface 38 of the preform member is bonded to the heat sink 18 and the bottom surface 40 thereof is bonded to the PGA unit 14 so as to permanently secure the same. The heat sink includes a plurality of radiating fins 42 and is held in place initially by retaining means formed on the bottom surface of the fixture. Then, the fixture and heat sink are placed on top of the preform disposed on the PGA unit so as to complete the assembled package 10.

Figure 2:
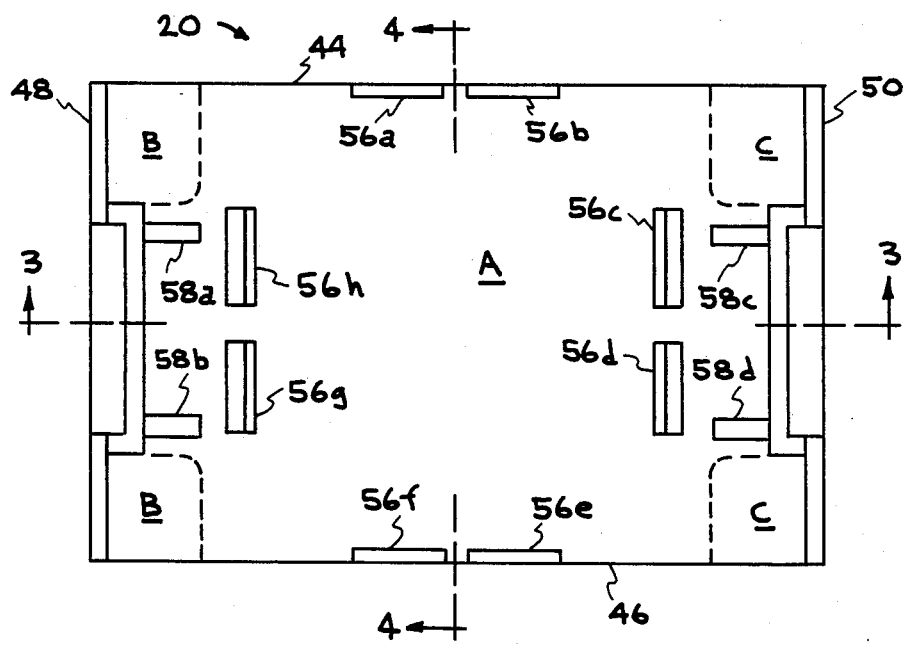
FIG. 2 is a bottom view of the fixture which is inverted from FIG. 1.
Figure 3:
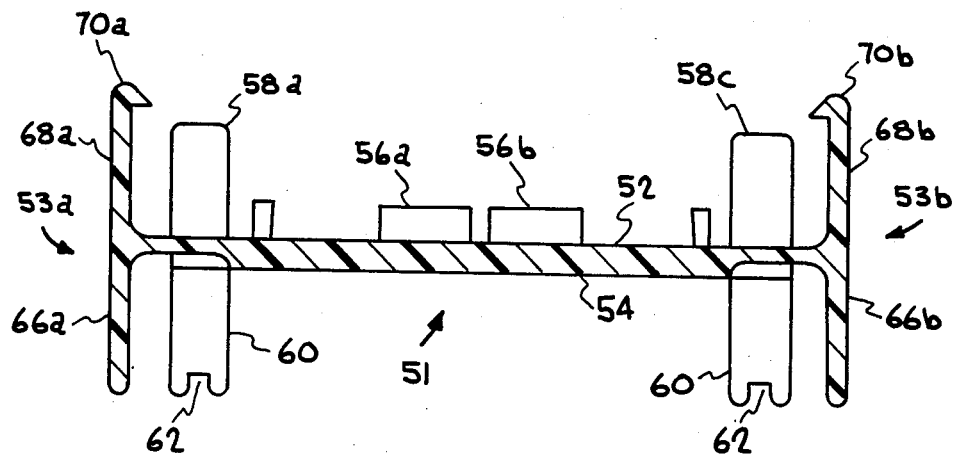
FIG. 3 is a side elevational view of the fixture of FIG. 2, taken along the lines 3—3.
Figure 4:
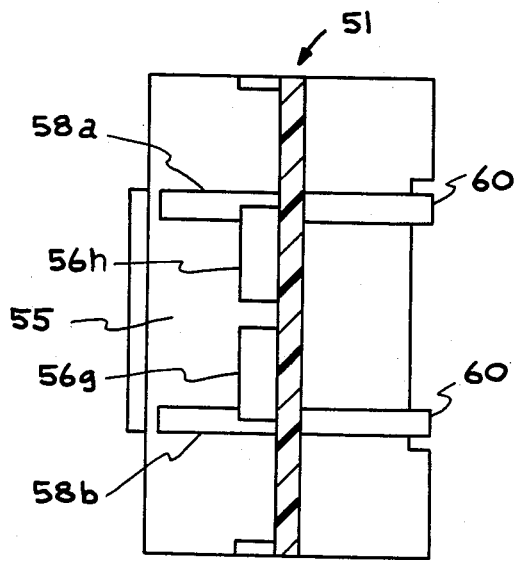
FIG. 4 is a right end elevational view of the fixture of FIG. 2, taken along the lines 4—4.

Referring now to FIGS. 2, 3 and 4 of the drawings, there are shown the mounting fixture 20 of the present invention which is used for mounting and alignment of the heat sink 18 and the preform member 16 to the PGA unit 14 disposed in the carrier 12. The fixture 20 has a substantially rectangular-shaped solid body member which is formed of a synthetic organic polymer such as a thermoplastic material. The fixture 20 is preferably fabricated as a single-piece of molded thermoplastic material by an injection molding process. The particular type of thermoplastic material that is selected must have suitable properties for injection molding as well as favorable thermal conductivity so as to withstand the operating temperatures of 20° C. of 150° C. Thus, the fixture 12 could be molded from a material such as glass reinforced polyphenylene sulfide.

As can be seen, FIGS. 2-4 show the fixture 20 inverted from its orientation in normal use as shown in FIG. 1. FIG. 2 is a bottom plan view of the fixture 20 having an upper side edge 44, a lower side edge 46, a left side edge 48 and a right side edge 50. The dimensions of the upper and lower side edges 44 and 46 are approximately 2.900 inches in length. The dimensions of the left and right side edges are approximately 1.800 inches in width. The fixture 20 is formed of a substantially flat, rectangular-shaped plate member 51, a left end portion 53a, and a right end portion 53b. The plate member 51 has a bottom surface 52 and a top surface 54. The plate member 51 has a thickness or height of approximately 0.100 inches. A plurality of vertical projections 56a-56h are formed on the bottom surface 52 to provide a partially enclosed, square-shaped area A which is used to releasably retain the heat sink 18 therein. Two vertical projections 56 are formed on each side of the horizontal and vertical center lines of the bottom surface 52 at a distance of approximately 0.900 inches from the center. Each of the projections 56a-56h has a dimension of approximately 0.350 inches in length, 0.050 inches in width, and 0.150 inches in height. The height of each projection is equal to the height of the heat sink so that their outer surfaces are flush therewith.

The bottom surface 52 of the plate member 51 further includes a plurality of vertical legs 58a-58d. The legs 58a and 58b are disposed between the left end portion 53a and the vertical projections 56h, 56g. The vertical projections 56g and 56h are spaced apart by about 1.00 inches. Similarly, the legs 58c and 58d are disposed between the right end portion 53b and the vertical projections 56c, 56d. The vertical projections 56c and 56d are also spaced apart by about 1.00 inches. The legs 58c and 58d are horizontally aligned with the respective legs 58a and 58b. Each of the legs has a dimension of approximately 0.250 inches in length, 0.100 inches in width and 0.457 inches in height. In use, the legs 58a–58d engage and rest on the top surface 29 adjacent the cavity 28 of the carrier 12 so as to support the fixture thereabove.

The top surface 54 of the plate member 51 also includes a plurality of legs 60 which are positioned diametrically opposite the respective legs 58a–58d on the bottom surface 52. The legs 60 are designed to have basically the same dimension as the legs 58a–58d. When used in a stacking arrangement for a number of assembled packages 10, the legs 60 are utilized to facilitate the supporting of the carrier in the assembly package located thereabove. In order to further facilitate such stacking, each of the legs 60 are provided with a cut-out 62 at its free end which is used to accommodate the bottom edges 37 located on the side portions 32 of the carrier.

The left end portion 53a is substantially rectangular in shape having a length of approximately 1.80 inches, a height of approximately 1.18 inches, and a thickness of approximately 0.100 inches. The left end portion 53a is joined at its intermediate area to the flat plate member 51 via reduced-thickness portions B. The reduced thickness portions B have a thickness of only 0.060 inches rather than the 0.100 inch thickness of the plate member which facilitates flexing of the end portion 53a. The portion 53a includes a first member 66a extending vertically above the surface of the plate member and a second member 68a extending vertically below the surface of the plate member. The second member 68a includes a hooked-portion 70a disposed at its lower end which is used to releasably engage the lower flange 36a (FIG. 1) of the PGA carrier 12 so as to secure the fixture thereto. The end portion 53a may have a window or cut-out portion 55 so as to further assist in facilitating its bending.

Similarly, the right end portion 53b is substantially rectangular in shape and has the same dimensions as the left end portion 53a. In particular, the right end portion 53b is also joined at its intermediate area to the flat plate member 51 via reduced portions C having a similar thickness as reduced thickness portions B. The right end portion 53b includes a first member 66b extending vertically above the surface of the plate member 51 and a second member 68b extending vertically below the surface of the plate member. The second member 68b includes a hooked-portion 70b disposed at its lower end which is used to releasably engage the lower flange 36b (FIG. 1) of the carrier so as to secure the fixture thereto. Likewise, the portion 53b may have a window or cut-out portion so as to facilitate its bending.

Prior to mounting or attachment of the fixture to the Murphy-type carrier, the heat sink 18 is placed into the area A on the bottom surface 52 of the fixture 20 and is retained releasably therein by the plurality of vertical projections 56a–56h. With the PGA unit 14 disposed in the Murphy-type carrier 12, the preform member 16 is then placed onto the top surface of the PGA unit 14 at its central portion. In order to permit the easy mounting of the fixture 20 containing the heat sink 18 onto the carrier 12 with the PGA unit 14 and the preform member 16 without the need of special tools or equipment, the first members 66a and 66b of the respective first end portions 53a, 53b define actuating means for moving outwardly the hooked portion 70a, 70b away from the center of the fixture 20.

The fixture 20 is simply affixed to the Murphy carrier 12 by applying pressure to squeeze the first members 66a, 66b toward each other with an index finger and a thumb. As a result, the hooked portions 70a, 70b are caused to pivot outwardly in the direction of arrows 72. Since the dimension between the hooked portions 70a and 70b will be slightly larger than the length of the Murphy-type carrier 12 when the hooked portions are pivoted outwardly, the fixture 20 may be placed over the lower flanges 36a, 36b of the carrier so that the legs 58a–58b will come to rest upon the top surface 29 adjacent the cavity 28 of the carriere. When the pressure on the oppositely depressed first members 66a, 66b are released for retaining or captivating the carrier, the hooked portions 70a, 70b will be snapped under the lower flanges 36a, 36b of the carrier so as to cause a locking engagement. As a result, the heat sink, preform member and PGA unit are automatically aligned in the vertical position and are held securely in place prior to the heat curing process.

The fixture 20 of the present invention, after it has been mounted to the Murphy-type carrier 12 so as to form the assembled package 10, is shown in FIG. 1 of the drawings. As can be seen, the fixture 20 is releasably secured to the carrier 12 by the interengagement of the hooked portions 70a, 70b with the lower flanges of the carrier. It will be understood that the height of the legs 60 on the top surface of the fixture 20 are all the same and are designed with the cut-outs 62 so as to receive the edges 37 on the sides 32 of the carrier. In this manner, a number of assembled packages can be stacked on top of each other when needed, as during the curing process.

The removal of the fixture 20 from the carrier 12 may be accomplished with a similar ease of operation. By applying pressure to squeeze the first members 66a, 66b toward each other again, the hooked portions 70a, 70b will pivot outwardly so as to be disengaged from the lower flanges 36a, 36b of the carrier 12. Then the fixture 20 may be lifted vertically away from the carrier. Since this removal operation is usually done after the curing process, the top and bottom surfaces 38, 40 of the preform member 16 will have been bonded to the respective surfaces of the heat sink 18 and the PGA unit 14. Accordingly, when the fixture 20 is being lifted, the heat sink will become disengaged from the vertical projections 56a–56g and will be permanently secured to the top surface 38 of the preform member 16 while the bottom surface 40 of the preform member is permanently secured to the PGA unit. As a result, the heat sink 18, the preform member 16 and the PGA unit 14 have all been bonded together in a vertical alignment.

From the foregoing detailed description, it can thus be seen that the present invention provides a fixture for mounting and aligning a heat sink to a chip package disposed in a PGA carrier. The fixture includes a substantially flat, rectangular shaped plate member, a first end portion and a second end portion. Further, the fixture of the present invention is of an extremely simple construction but yet is strong enough to handle the physical abuse encountered in the production environment.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A fixture for mounting and aligning a heat sink to a PGA chip package disposed in a Murphy-type carrier, said fixture comprising:
   a substantially flat, rectangular-shaped plate member (51) having a top surface (54) and a bottom surface (52), said plate member (51) being formed of a top side edge (44), bottom side edge (46), left side edge (48) and a right side edge (50);
   a first end portion (53a) being formed of a rectangular shape and joined at its intermediate area to the left side edge (48) of said plate member (51);
   a second end portion (53b) being formed of a rectangular shape and joined at its intermediate area to the right side edge (50) of said plate member (51);
   retaining means being formed in a central portion of the bottom surface (52) for releasably holding the heat sink;
   said first end portion (53a) including a first member (66a) extending vertically above the top surface (54) of said plate member (51) and a second member (68a) extending vertically below the bottom surface (52) of said plate member (51);
   said second member (68a) of said first end portion (53a) having a hooked portion (70a) disposed at its lower end;
   said second end portion (53b) including a first member (66b) extending vertically above the top surface (54) of said plate member (51) and a second member (68b) extending vertically below the bottom surface (52) of said plate member (51);
   said second member (68b) of said second end portion (53b) having a hooked portion (70b) disposed at its lower end; and
   said hooked portions (70a, 70b) being moved outwardly away from the central portion of the fixture when said first members (66a, 66b) of the respective first and second end portions (53a, 53b) are squeezed toward each other so as to permit mounting or removal of the fixture to the Murphy-type carrier.

2. A fixture as claimed in claim 1, wherein said retaining means comprises a plurality of vertical projections (56) disposed on the bottom surface (52) of said plate member (51) and being spaced apart at equal distances from the center portion of the fixture.

3. A fixture as claimed in claim 2, wherein said vertical projections (56) are positioned adjacent at least two oppositely disposed sides of said plate member (51).

4. A fixture as claimed in claim 3, wherein the number of said vertical projections (56) is at least two.

5. A fixture as claimed in claim 1, further comprising first support means extending downwardly from the bottom surface (52) of said plate member (51) for engaging a top surface of said carrier.

6. A fixture as claimed in claim 5, wherein said first support means comprises a plurality of legs (58a–58d) disposed adjacent said second members (68a, 68b) of said first and second end portions (53a, 53b).

7. A fixture as claimed in claim 6, further comprising second support means extending vertically from the top surface (54) of said plate member (51) for engaging a bottom edges of another carrier which is stacked thereabove.

8. A fixture as claimed in claim 7, wherein said second support means comprises a plurality of second legs (60) disposed diametrically opposite said first legs (58a–58d) on the bottom surface (52) of the fixture.

9. A fixture as claimed in claim 8, wherein said second legs (60) each has a cut-out (62) at its free end so as to receive the bottom edges of said another carrier, thereby facilitating stacking.

10. A fixture as claimed in claim 1, wherein said fixture is formed of a single-piece molded configuration.

11. A fixture as claimed in claim 10, wherein said fixture is molded from a thermoplastic material.

12. A fixture for mounting and aligning a heat sink to a PGA chip package disposed in a Murphy-type carrier, said fixture comprising:
    plate member means (51) being formed of four sides, a top surface, and a bottom surface; retaining means being formed on the bottom surface of said plate member means for receiving the heat sink therein;
    end member means pivotally connected on opposite sides of two of said four sides of said plate member means and including hooked portion for releasably engaging a bottom surface of said carrier; and
    said end member means further including actuating means for moving outwardly said hooked portions away from the center of said plate member means so as to permit the mounting or removal of the fixture to the carrier.

13. A fixture as claimed in claim 12, wherein said retaining means comprises a plurality of vertical projections (56) disposed in the bottom surface (52) of said plate member means (51) and being spaced apart at equal distances from the center portion of the fixture.

14. A fixture as claimed in claim 13, wherein said vertical projections (56) are positioned adjacent at least two oppositely disposed sides of said plate member means (51).

15. A fixture as claimed in claim 14, wherein the number of said vertical projections (56) is at least two.

16. A fixture as claimed in claim 12, further comprising first support means extending downwardly from the bottom surface (52) of said plate member means (51) for engaging a top surface of said carrier.

17. A fixture as claimed in claim 16, further comprising second support means extending vertically from the top surface (54) of said plate member means (51) for engaging a bottom edges of another carrier which is stacked thereabove.

18. A fixture as claimed in claim 12, wherein said fixture is formed of a single-piece molded configuration.

19. A fixture as claimed in claim 18, wherein said fixture is molded from a thermoplastic material.

* * * * *